United States Patent
Ide et al.

(10) Patent No.: US 7,728,251 B2
(45) Date of Patent: Jun. 1, 2010

(54) PLASMA PROCESSING APPARATUS WITH DIELECTRIC PLATES AND FIXING MEMBER WAVELENGTH DEPENDENT SPACING

(75) Inventors: Tetsuya Ide, Yokohama (JP); Atsushi Sasaki, Yokohama (JP); Kazufumi Azuma, Yokohama (JP); Yukihiko Nakata, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 11/259,190

(22) Filed: Oct. 27, 2005

(65) Prior Publication Data

US 2006/0090704 A1    May 4, 2006

(30) Foreign Application Priority Data

Oct. 29, 2004   (JP) .............................. 2004-316870

(51) Int. Cl.
    B23K 10/00   (2006.01)
(52) U.S. Cl. .............................. 219/121.43; 219/121.4; 219/121.36; 118/723 MW; 315/111.41; 156/345.41; 204/298.38
(58) Field of Classification Search ............ 219/121.43, 219/121.4, 121.41, 746, 748; 118/723 MW, 118/723 MA, 723 ME, 723 AN; 204/298.19, 204/298.38, 192.12; 156/345.36, 345.41; 315/111.21, 111.41
    See application file for complete search history.

(56) References Cited

U.S. PATENT DOCUMENTS

| | | | | |
|---|---|---|---|---|
| 2,963,702 A | * | 12/1960 | Walters | ................. 343/709 |
| 3,774,224 A | * | 11/1973 | Shibano et al. | ............. 343/872 |
| 6,620,290 B2 | * | 9/2003 | Yamamoto et al. | ..... 156/345.41 |
| 6,953,005 B2 | * | 10/2005 | Suzuki | ................. 118/723 AN |
| 2001/0010207 A1 | * | 8/2001 | Yamamoto et al. | .. 118/723 MW |
| 2002/0002948 A1 | * | 1/2002 | Hongo et al. | ........... 118/723 R |
| 2002/0123200 A1 | | 9/2002 | Yamamoto et al. | |
| 2003/0024647 A1 | * | 2/2003 | Tadera et al. | ........... 156/345.41 |
| 2004/0107910 A1 | * | 6/2004 | Nakata et al. | ....... 118/723 MW |
| 2004/0183453 A1 | * | 9/2004 | Suzuki | ................. 315/111.71 |
| 2006/0137613 A1 | | 6/2006 | Kasai | |
| 2006/0150914 A1 | | 7/2006 | Yamamoto et al. | |
| 2007/0254113 A1 | | 11/2007 | Hongo et al. | |

FOREIGN PATENT DOCUMENTS

| | | |
|---|---|---|
| JP | 7-142194 | 6/1995 |
| JP | 7-272897 | 10/1995 |
| JP | 8-31593 | 2/1996 |
| JP | 8-250477 | 9/1996 |
| JP | 8-274065 | 10/1996 |
| JP | 8-279490 | 10/1996 |
| JP | 8-316198 | 11/1996 |

(Continued)

*Primary Examiner*—Stephen J Ralis
(74) *Attorney, Agent, or Firm*—Birch, Stewart, Kolasch & Birch LLP

(57) ABSTRACT

In a plasma processing apparatus, electromagnetic waves are radiated from slots of waveguides into a processing chamber via dielectric windows that are supported on beams, thereby generating a plasma. A substrate, which is an object of processing, is processed by the generated plasma. Dielectric plates are attached to those surfaces of the beams, which are opposed to the processing chamber. The thickness of each dielectric plate is set at ½ or more of the intra-dielectric wavelength of the electromagnetic waves. Using the plasma processing apparatus, a large-area processing can uniformly be performed.

9 Claims, 11 Drawing Sheets

FOREIGN PATENT DOCUMENTS

| | | |
|---|---|---|
| JP | 9-95772 | 4/1997 |
| JP | 9-102488 | 4/1997 |
| JP | 10-92797 | 4/1998 |
| JP | 10-199698 | 7/1998 |
| JP | 10-255999 | 9/1998 |
| JP | 10-275524 | 10/1998 |
| JP | 11-121196 | 4/1999 |
| JP | 2001-274151 | 10/2001 |
| JP | 2002-170818 | 6/2002 |
| JP | 2003-051493 | 2/2003 |
| JP | 2004-265954 | 9/2004 |
| JP | 2004-266268 | 9/2004 |
| JP | 2004-289099 | 10/2004 |

\* cited by examiner

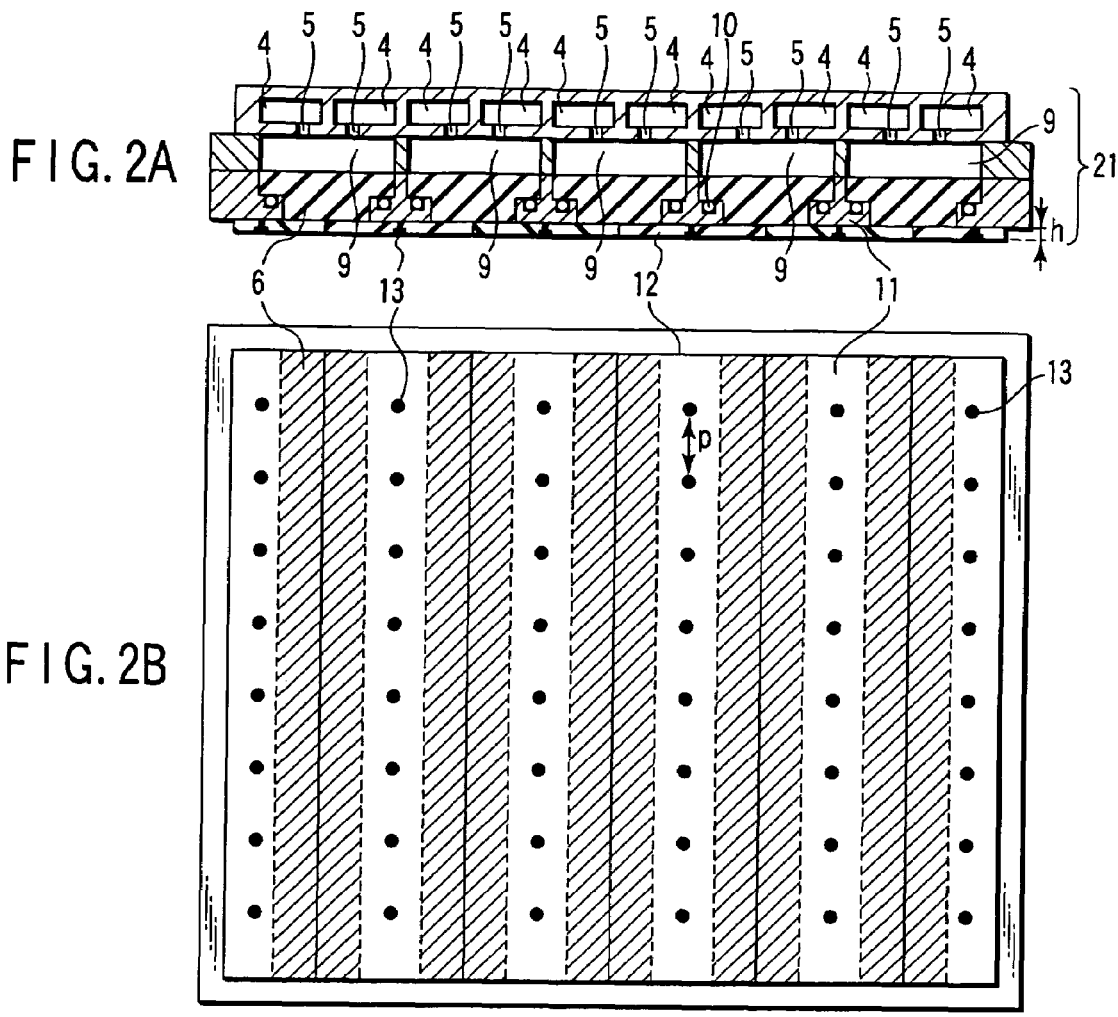
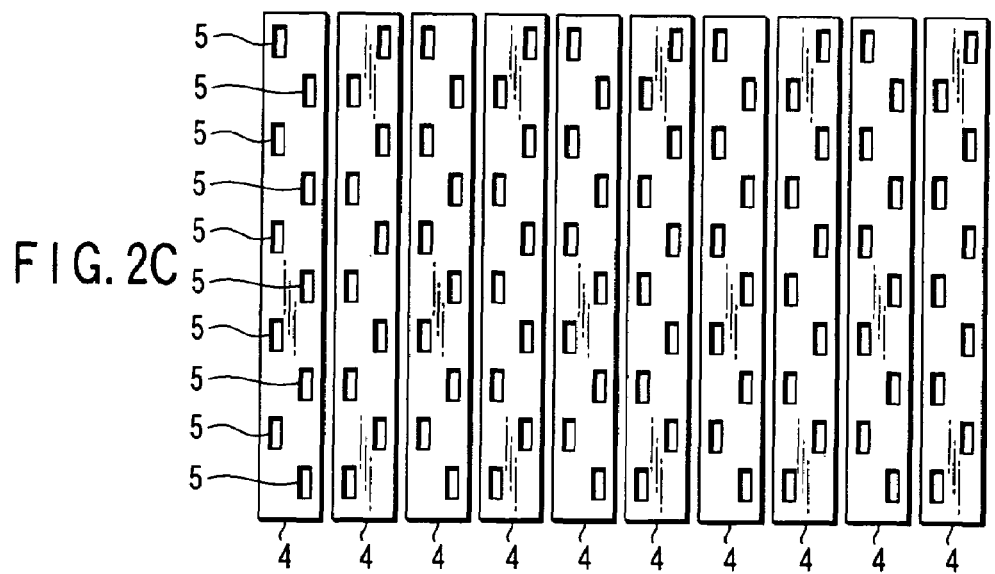
FIG. 2A
FIG. 2B
FIG. 2C

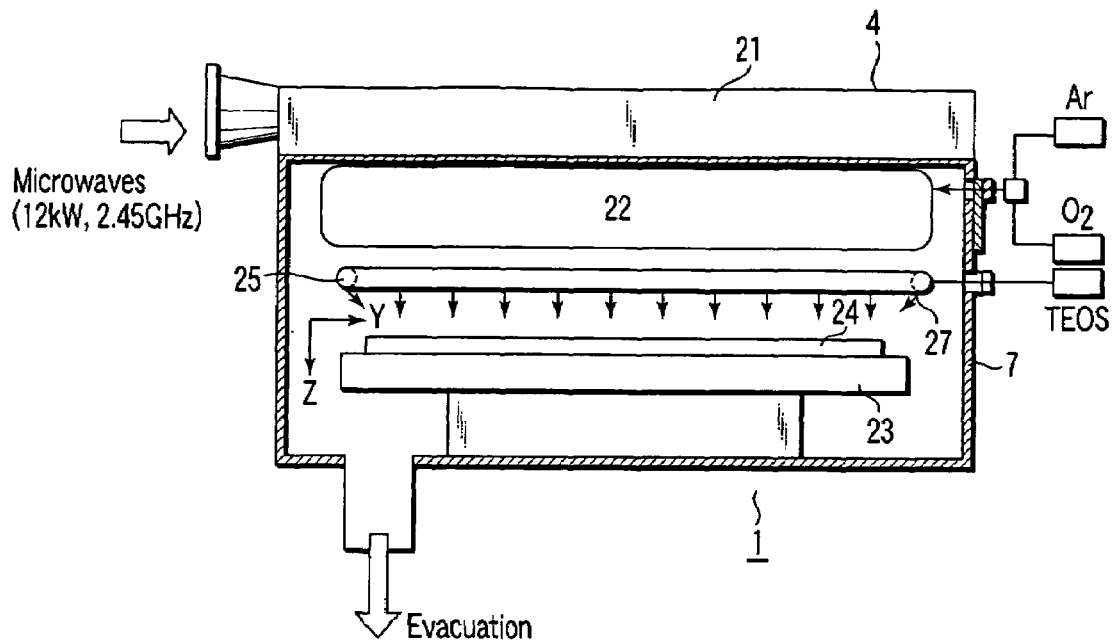
F I G. 4A
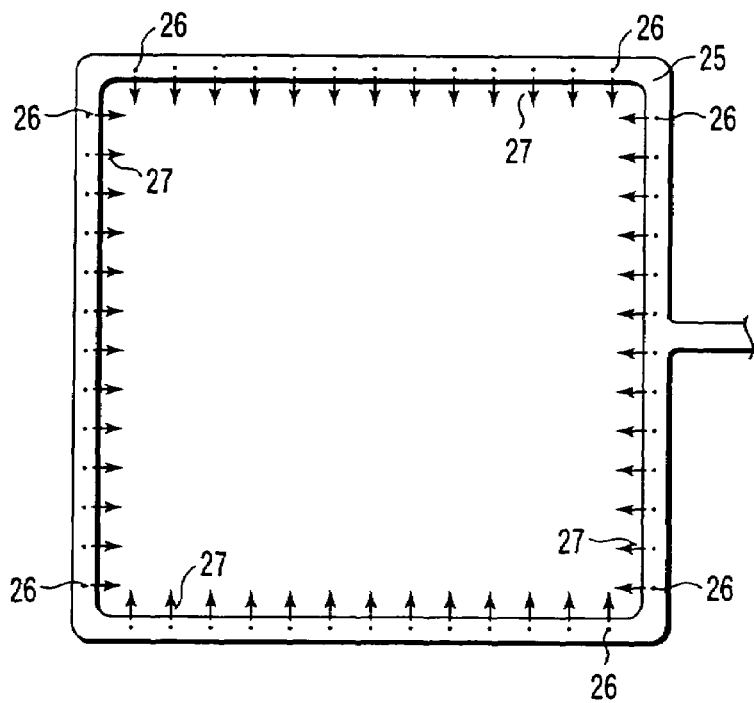
F I G. 4B

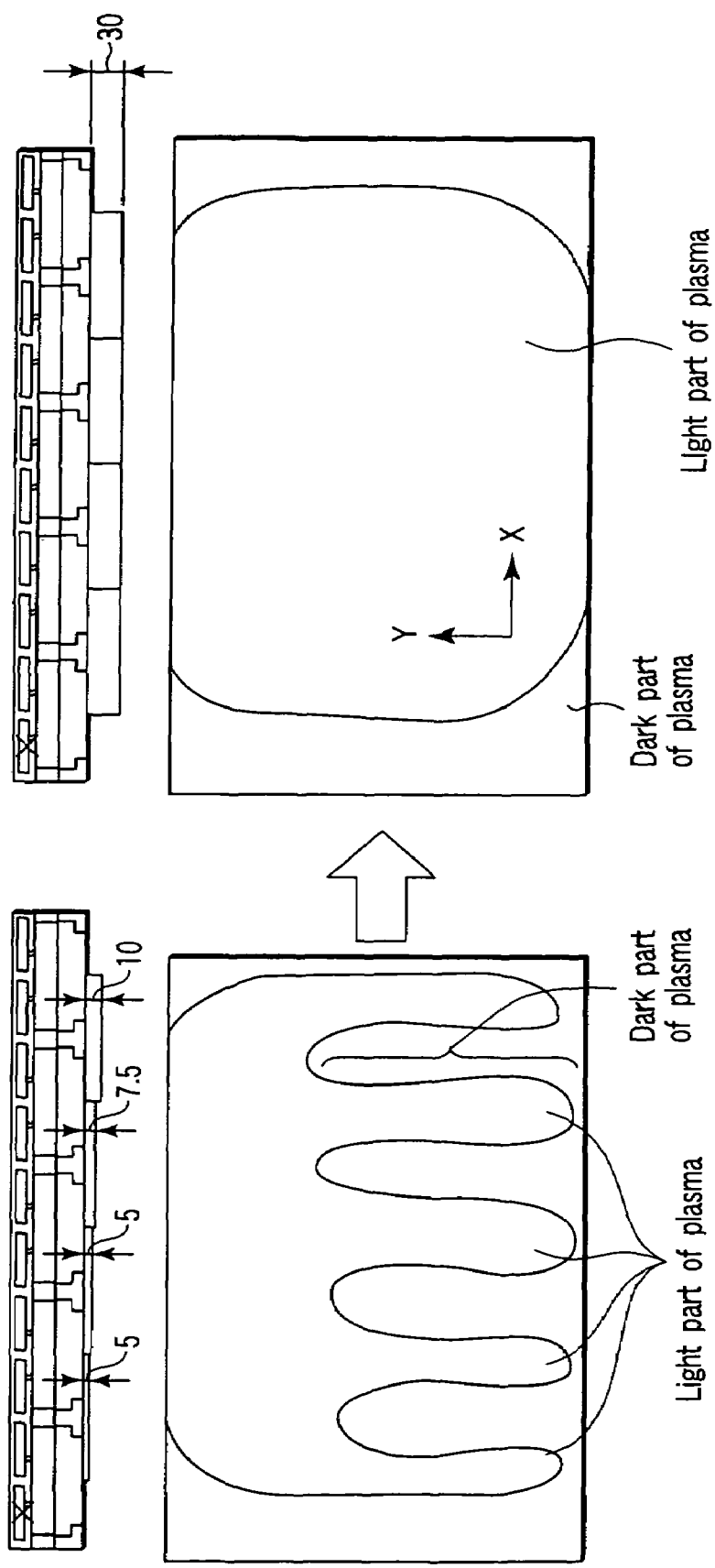
F I G. 6B
F I G. 6A

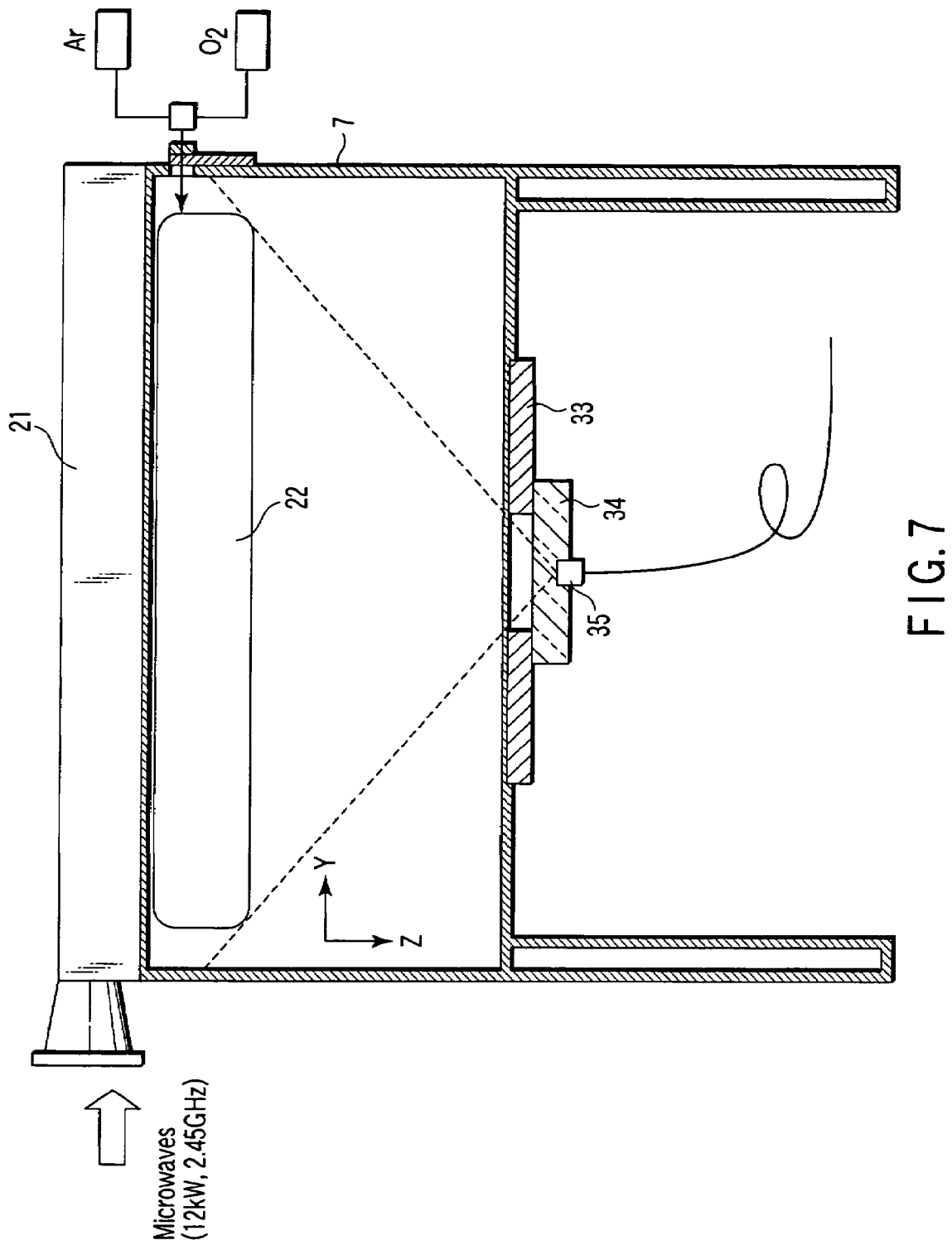
F I G. 7

PLASMA PROCESSING APPARATUS WITH DIELECTRIC PLATES AND FIXING MEMBER WAVELENGTH DEPENDENT SPACING

CROSS-REFERENCE TO RELATED APPLICATIONS

This application is based upon and claims the benefit of priority from prior Japanese Patent Application No. 2004-316870, filed Oct. 29, 2004, the entire contents of which are incorporated herein by reference.

BACKGROUND OF THE INVENTION

1. Field of the Invention

The present invention relates to a plasma processing apparatus that is applied to a fabrication process of a semiconductor device such as a thin-film transistor (TFT) or a metal oxide semiconductor device (MOS device), a semiconductor device such as a semiconductor integrated circuit device, or a display device such as a liquid crystal display device.

2. Description of the Related Art

Conventionally, a plasma apparatus, such as a parallel-plate radio-frequency plasma processing apparatus or an electron cyclotron resonance (ECR) plasma processing apparatus, has been used to execute a plasma process, such as film deposition, surface modification or etching, in a process of fabricating, for instance, semiconductor devices and liquid crystal display devices.

In the case of using radio-frequency waves for excitation of plasma, radio-frequency waves are radiated from an antenna, and electrons are accelerated by radio-frequency electromagnetic field, thereby maintaining the plasma. The electromagnetic field in the vicinity of the antenna includes three electromagnetic field components, that is, a radiant wave, an induction electric field and a static electric field, which decrease in proportion to $f^{-1}$, $f^{-2}$ and $f^{-3}$, relative to a frequency f. As the frequency for exciting the plasma becomes higher, the induction electric field becomes dominant over the static electric field. In a microwave range with higher frequencies, the radiant wave becomes dominant. Because of this frequency dependence of electromagnetic fields in the vicinity of the antenna, when plasma excitation is executed with frequencies from the HF range to the VHF range, an electrostatic-coupling (capacitive-coupling) type parallel-plate apparatus is used. On the other hand, in the case of microwaves, an apparatus, which is configured to execute plasma excitation by electromagnetic waves radiated from the antenna, is used.

The parallel-plate plasma processing apparatus, however, has such a problem that the plasma density is low and the electron temperature is high. In addition, the ECR plasma processing apparatus requires a DC magnetic field for plasma excitation, and there arises such problems that the apparatus becomes complex and large in size and the processing of a large-diameter semiconductor substrate is difficult.

To solve the above problems, there has been proposed a microwave plasma processing apparatus that requires no magnetic field for plasma excitation and is capable of generating a high-density plasma with low electron temperatures (see, e.g. Jpn. Pat. Appln. KOKAI Publication No. 7-142194). In this case, electromagnetic waves are radiated through a dielectric window into a reaction chamber where a plasma process is performed. In general, the dielectric window passes microwaves and maintains a vacuum state in the reaction chamber by means of, e.g. an O-ring, and the dielectric window is exposed to a processing plasma. Thus, the dielectric window needs to be formed of a material that has good microwave introduction characteristics, a mechanical strength and heat resistance against a mechanical stress due to an atmospheric pressure and a thermal stress due to heat from the plasma, and a corrosion resistance to a plasma that is produced from, e.g. a fluorine-based gas that is used for the plasma process and cleaning. Various proposals have been made in order to fabricate a dielectric window with such characteristics.

For example, it is proposed that the thickness of a dielectric window is set at an n/2-number of times or n-number of times (n=an integer) of a half-wavelength of microwaves so as to take advantage of an interference effect of incidence and reflection, thereby to achieve good microwave introduction characteristics, that is, stable discharge of plasma (see, e.g. Jpn. Pat. Appln. KOKAI Publications Nos. 10-255999 and 10-199698). Moreover, to achieve a resistance to mechanical stress and thermal stress, there have been proposed a method in which the thickness of a dielectric window is set at a very great value and a method in which a dielectric window is provided only at a partly formed aperture portion (see, e.g. Jpn. Pat. Appln. KOKAI Publication No. 7-272897). Besides, in order to improve the heat resistance and the corrosion resistance at the time of using fluorine-based gas, an attempt has been made to form the dielectric window of a ceramic material such as aluminum nitride (AlN) or alumina ($Al_2O_3$) or of a material coated with such a ceramic material (see, e.g. Jpn. Pat. Appln. KOKAI Publications Nos. 9-95772, 10-275524, 8-279490 and 9-102488).

In recent years, studies have been made as to whether the microwave plasma processing apparatus is applicable to processing of semiconductor substrates with greater diameters or to larger-area substrates for LCDs, etc. In order to realize processing of larger-area substrates, it is necessary to further improve the mechanical and thermal strength of the dielectric window. In order to clear the problem, there has been proposed a technique wherein metallic beams are provided on a cover member to which a dielectric window of a process chamber is to be attached, and the dielectric window is divided (see, e.g. Jpn. Pat. Appln. KOKAI Publications Nos. 8-250477, 8-274065 and 10-92797).

As methods for generating a large-area plasma, there have been proposed a method of using a plurality of microwave waveguides (see, e.g. Jpn. Pat. Appln. KOKAI Publications Nos. 8-316198 and 8-31593), and a method in which a microwave introducing section is configured to have an annular structure with slots, thereby to realize reduction in size of the apparatus while enabling large-area processing (see, e.g. Jpn. Pat. Appln. KOKAI Publication No. 11-121196).

BRIEF SUMMARY OF THE INVENTION

As regards plasma processing apparatus using electromagnetic waves such as microwaves, Jpn. Pat. Appln. KOKAI Publications Nos. 8-250477, 8-274065 and 10-92797 disclose methods wherein dielectric windows are supported on metallic beams provided on a cover member, thereby to execute large-area processing. In these methods, when microwaves are radiated into the processing chamber via the dielectric windows, the microwaves are cut off since the conductor parts of the metallic beams are exposed. Consequently, no plasma is generated at the regions of the beams, and the uniformity in plasma is considerably deteriorated. This leads to deterioration in uniformity of processing of a semiconductor substrate or a large-sized substrate for LCDs, which is processed by the plasma, deterioration in uniformity in thickness and quality of a deposited film in, e.g. CVD (Chemical Vapor Deposition), and deterioration in etch uniformity in an etching process.

The object of the present invention is to provide a plasma processing apparatus that is capable of uniformly generating a large-area plasma.

According to an aspect of the present invention, there is provided a plasma processing apparatus comprising: a processing chamber in which a to-be-processed substrate is placeable; an electromagnetic source that outputs electromagnetic waves; a plurality of waveguides that propagate the electromagnetic waves; a plurality of slots that are formed in each of the waveguides and constitute a waveguide antenna that radiates the electromagnetic waves; and a plurality of dielectric windows that are formed of a dielectric material, associated with the slots that are formed in each of the waveguides, and provided as a seal surface at one face of the processing chamber, wherein a plasma is generated by the electromagnetic waves that are radiated from the slots into the processing chamber via the dielectric windows, and the generated plasma processes the substrate, and wherein dielectric plates are provided on inner surfaces of the dielectric windows of the processing chamber, and a thickness of each of the dielectric plates in a direction in which the electromagnetic waves propagate is set at ½ or more of an intra-dielectric-plate wavelength of the electromagnetic waves.

Preferably, the thickness of the dielectric plate is given by the following equation (2) that is derived from the equation (1), which appears on page 165 of "Microwave Optics" (Academic Pr.):

$$2\pi \cdot h \cdot (\epsilon_d - \sin^2\alpha)^{0.5}/\lambda = m \cdot \pi \quad (1)$$

$$h = (m \cdot \pi \cdot \lambda)/(2\pi \cdot (\epsilon_d)^{0.5} \cdot \cos\beta) \quad (2)$$

where h: the thickness of the dielectric, m: an integer of 1 or more, λ: a wavelength of the electromagnetic waves in a vacuum, $\epsilon_d$: a specific inductive capacity of the dielectric plate, α: the incidence angle at which the electromagnetic waves are incident on the dielectric plate, and β: the refraction angle at which the electromagnetic waves are incident on the dielectric plate.

According to another aspect of the present invention, there is provided a plasma processing apparatus including a plurality of waveguides that are distributed from an electromagnetic wave source, and a dielectric window that is associated with a slot antenna provided in each of the waveguides and constitutes a seal surface of a processing chamber, the apparatus comprising: a plurality of dielectric plates that are provided on an inner surface of the dielectric window; and means for generating a surface-wave plasma on inner wall surfaces of the dielectric plates, wherein each of the dielectric plates has a thickness that is equal to or greater than such a thickness as to propagate electromagnetic waves within the dielectric plate.

According to still another aspect of the present invention, there is provided a plasma processing apparatus comprising: a processing chamber in which a to-be-processed substrate is placeable; an electromagnetic source that outputs electromagnetic waves; a plurality of waveguides that propagate the electromagnetic waves; a plurality of slots that are formed in each of the waveguides and constitute a waveguide antenna that radiates the electromagnetic waves; and a plurality of dielectric windows that are formed of a dielectric material, associated with the slots that are formed in each of the waveguides, and provided as a seal surface at one face of the processing chamber, wherein a plasma is generated by the electromagnetic waves that are radiated from the slots into the processing chamber via the dielectric windows, and the generated plasma processes the substrate, and wherein dielectric plates are provided on inner surfaces of the dielectric windows of the processing chamber, the dielectric plates are fixed to beams by a plurality of fixing members that are spaced apart with a pitch of ½ or more of an intra-dielectric-plate wavelength, and are at least partly formed of a conductive material.

Preferably, the fixtures are arranged such that the fixtures are spaced apart with a pitch of an n-number (n=an integer of 1 or more) of times of ½ of the intra-dielectric-plate wavelength of the electromagnetic waves.

The present invention can provide a plasma processing apparatus that is capable of uniformly generating a large-area plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2A schematically shows an electromagnetic wave introducing section according to the present invention;

FIG. 2B is a bottom view of the electromagnetic wave introducing section;

FIG. 2C shows an arrangement of slots 5 that are provided in each waveguide 4;

FIG. 4A schematically shows a positional relationship between the electromagnetic wave introducing section, a plasma, a gas ring, a to-be-processed substrate, and a processing chamber;

FIG. 4B shows the gas ring alone, as viewed from the to-be-processed substrate side;

FIG. 6A illustrates the light-emission state of plasma in a case where the thickness of dielectric plates is variously set in a range of 3 to 10 mm;

FIG. 6B illustrates the light-emission state of plasma in a case where the thickness of the dielectric plates is set at 30 mm;

FIG. 7 illustrates a method of observing the light-emission state of plasma;

DETAILED DESCRIPTION OF THE INVENTION

Figure 1:
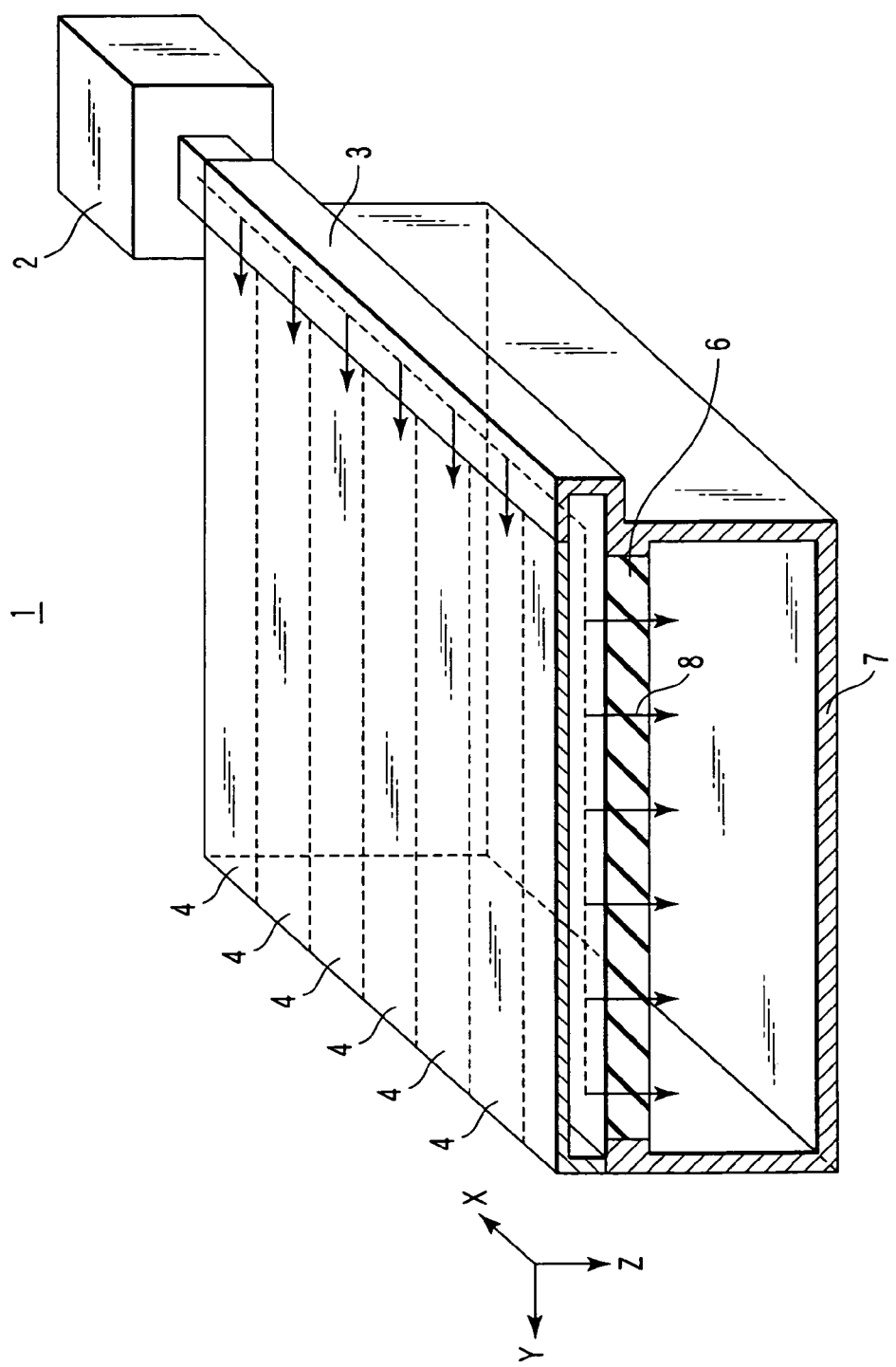
FIG. 1 schematically shows a plasma processing apparatus in order to explain the present invention.

An embodiment of the present invention will now be described with reference to FIG. 1 through FIG. 4B. In the description below, the common parts in the Figures are denoted by like reference numerals. FIG. 1 schematically shows the structure of a plasma processing apparatus 1 according to the embodiment. The plasma processing apparatus 1 includes an electromagnetic wave source. The electromagnetic wave source is, for instance, a microwave oscillator 2 with a frequency of, e.g. 2.45 GHz and a maximum output of 12 kW. The microwave oscillator 2 is connected to, for example, a linear distribution waveguide 3 for uniformly distributing microwaves to a plurality of waveguides.

A plurality of waveguides 4 are connected to the distribution waveguide 3 such that the waveguides 4 are disposed perpendicular to the distribution waveguide 3. The distribution waveguide 3 distributes electromagnetic waves, which are oscillated from the electromagnetic wave source, to the waveguides 4. A plurality of slots 5 (not shown in FIG. 1), which function as antennas for electromagnetic waves that are distributed to the waveguides 4, are formed in the lower surface of the respective waveguides 4.

One surface of the processing chamber 7, for example, the upper wall surface of the processing chamber 7, is coupled to the processing chamber 7 as a microwave circuit so that the electromagnetic waves coming from the slots 5 of the waveguides 4 may be radiated into the processing chamber 7. Specifically, the upper wall surface of the processing chamber 7 is provided with a plurality of dielectric windows 6 that pass electromagnetic waves and are sealed as a wall surface (e.g. upper wall surface) of the processing chamber 7. The number of dielectric windows 6 is plural. Each dielectric window 6 passes electromagnetic waves, e.g. microwaves, which are propagated from the associated waveguides 4. The dielectric windows 6 are supported as one piece by metallic beams 11, for instance, aluminum beams 11, thereby constituting the seal surface of the processing chamber 7.

On the inside of the seal surface, a plurality of dielectric plates 12, such as quarts plates, are provided. The dielectric plates 12 are fixed to the beams 11 by fixing members, for instance, dielectric plate fixing screws 13. The dielectric plates 12 are provided in order to uniformly generate a plasma within the processing chamber 7. In this embodiment, one dielectric window 6 is provided in association with two waveguides 4. That is, one rectangular dielectric window 6 is disposed in parallel to the longitudinal axis of the associated waveguides 4.

The slots 5 in each waveguide 4 are arranged in a checkered pattern, for example, as shown in FIG. 2C. With this arrangement, microwaves emerging from the slots 5 of the neighboring waveguides 4 have opposite phases. Electromagnetic waves 8 are radiated into the processing chamber 7 through the dielectric windows 6, such as quartz windows, which are formed of a dielectric material.

FIG. 2A is a cross-sectional view for describing the positional relationship between the waveguides 4, slots 5, dielectric windows 6 and dielectric plates 12. FIG. 2B is a plan view of the structure shown in FIG. 2A, as viewed from the dielectric plate 12 side. In FIGS. 2A and 2B, ten waveguides 4 are used as the plural waveguides 4. The ten waveguides 4 may be configured such that ten individual waveguides 4 are separately disposed or waveguide paths corresponding to ten waveguides 4 are bored in a single metallic plate, as shown in FIG. 2A.

The slots 5 are provided in the lower surfaces of the waveguides 4, and electromagnetic waves are radiated into cavity portions 9 via the slots 5. The cavity portions 9 are provided for the following reason. If electromagnetic waves are directly made incident on the large-area dielectric window 6 from the small-opening-area slots 5 without the intervention of cavity portion 9, it would become difficult to attain matching of electromagnetic waves on the surface of the dielectric window 6. As a result, the reflectance of electromagnetic waves would excessively increase. To avoid this undesirable situation, the cavity portions 9 are provided to realize smooth introduction of electromagnetic waves.

The radiated electromagnetic waves enter the cavity portions 9. Under each cavity portion 9, the dielectric window 6 is supported on the beams 11. Each beam 11 has a groove for receiving an O-ring 10 that maintains a vacuum between the processing chamber 7 and dielectric window 6. The O-ring 10 is received in the groove such that the surface of the O-ring 10 air-tightly contacts the dielectric window 6.

Each dielectric plate 12 is fixed on the associated beam 11 by means of dielectric plate fixing screws 13, which are fitted in screw holes that are formed in the lower surface of the beam 11, for example, with a regular pitch p. The dielectric plate fixing screws 13 are metallic screws and are formed of, e.g. aluminum, an aluminum alloy, stainless steel, a nickel alloy, titanium, etc. The head of each dielectric plate fixing screw 13, which comes in direct contact with plasma, is coated with a dielectric material such as alumina ($Al_2O_3$), thereby to prevent corrosion or oxidation due to a fluorine-based corrosive gas plasma or an oxygen-based oxidizing gas plasma. The coating is implemented by plasma spraying, anodic oxidation, sputtering, etc. The above-described structural components, which comprise the waveguides 4, dielectric windows 6, dielectric plates 12 and dielectric plate fixing screws 13, constitute an electromagnetic wave introducing section 21.

Figure 3:
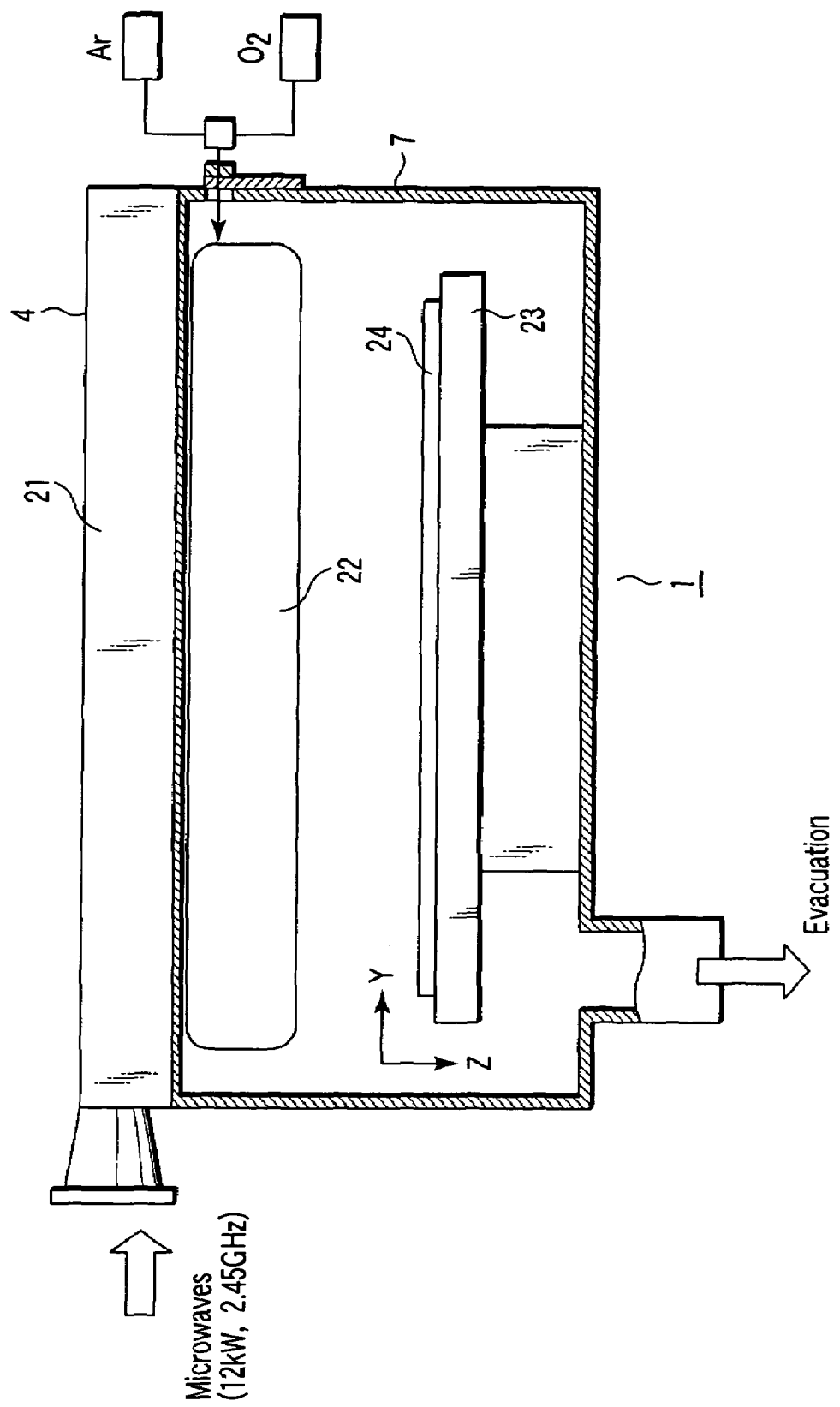
FIG. 3 schematically shows a positional relationship between the electromagnetic wave introducing section, a plasma, a to-be-processed substrate, and a processing chamber.

FIG. 3 is a cross-sectional view that shows the positional relationship between the electromagnetic wave introducing section 21, plasma 22, the processing chamber 7 for plasma processing, and a to-be-processed substrate 24. The internal structure of the electromagnetic wave introducing section 21 is shown in FIG. 2. The electromagnetic wave introducing section 21 is disposed on top of the processing chamber 7.

The electromagnetic wave introducing section 21 may be constructed by processing the upper cover of the processing chamber 7. In this case, an opening/closing mechanism is coupled to the electromagnetic wave introducing section 21. For example, at a time of maintenance, the electromagnetic wave introducing section 21 is opened to permit replacement of parts, cleaning, etc. in the processing chamber 7 and electromagnetic wave introducing section 21. The processing chamber 7 is kept in a vacuum state or a near-vacuum low-pressure state by an evacuation pump (not shown).

A work table 23, on which the to-be-processed substrate 24 is placed, and a vertical movement mechanism (not shown), which vertically moves the work table 23 for carrying the substrate 24 into/out of the processing chamber 7 in a vacuum, are disposed within the processing chamber 7 that is opposed to the electromagnetic wave introducing section 21. In order to form an oxide film on the surface of a silicon film of the substrate 24, plasma oxidation was executed with a distance between the dielectric plate 12 and the silicon film being set at, e.g. 15 cm. As a result, an oxide film with a uniform film thickness distribution in the range of 3.1±0.4 nm (13%) was successfully formed on the surface of the silicon film of the rectangular substrate 24 with a size of, e.g. 1 m×85 cm.

In the vicinity of the dielectric plate 12 within the processing chamber 7, there are provided a first gas supply pipe for supplying a first process gas for plasma generation, and a second gas supply pipe for supplying a second process gas for processing such as film formation, oxidation, nitridation, etching and ashing. After the substrate 24 is carried in from outside by a substrate carrying mechanism, the processing chamber 7 is set in a vacuum state or a low-pressure state by the evacuation pump. The substrate 24 is placed on the work table 23, and process gases are introduced in the processing chamber 7 from the first and second gas supply pipes. In FIG. 3, oxygen, which is the first process gas for plasma oxidation, and argon (Ar), which is the second process gas, are introduced from the first and second gas supply pipes, which are provided at the side surface of the processing chamber 7, by means of a gas introducing system that comprises, for example, a mass-flow controller and a gas valve. The direction in which the gases are fed into the processing chamber 7 from the first and second gas supply piles is the axial direction of the processing chamber 7.

As the first process gas, a gas for plasma generation is selected in the case of a process for forming an oxide film on the surface of a silicon thin film or a process for forming a silicon dioxide film. The first process gas is not limited to oxygen, and may be a gas containing oxygen atoms, such as $CO_2$, $O_3$, or $H_2O$.

The second process gas is a gas for performing processing, and varies depending on a film to be processed. The second process gas is not limited to Ar, and may be an inert gas such as He, Ne, Kr or Xe. In the case of performing not an oxidation process but a process for forming a silicon dioxide film by CVD, an organic silicon compound such as TEOS (Tetraethylorthosilicate) may be used in place of, or in addition to, the noble gas such as Ar.

In another embodiment of the process gas supply method illustrated in FIG. 3, a gas ring as shown in FIGS. 4A and 4B may be employed. FIG. 4A is a cross-sectional view that shows the positional relationship between the processing chamber 7, to-be-processed substrate 24, etc., in the case of using the gas ring 25 for introducing TEOS. FIG. 4B shows the gas ring 25 alone, as viewed from the to-be-processed substrate 24 side. The gas ring 25 is a large rectangular ring and has a size that is substantially equal to, or greater than, the size of the substrate 24. The gas ring 25 is provided with many gas introducing apertures 26 for feeding gas flows 27 of TEOS toward the substrate 24. The gas introducing apertures 26 are opened in an obliquely downward direction (toward the substrate 24) so that the gas flows 27 from the apertures 26 may uniformly reach the substrate 24. The embodiment shown in FIGS. 4A and 4B relate to a microwave remote plasma apparatus. In this apparatus, microwaves that are propagated from the waveguides 4 decompose the process gas that is fed from the first gas supply pipe and generate a plasma. If the electron density of the plasma reaches a certain level, surface waves propagate along the surface of the plasma. As a result, a surface-wave plasma is generated on the inner wall surface of the dielectric plate 12. Since electromagnetic waves propagate in the dielectric plate 12, the surface-wave plasma is generated uniformly over the entire surface of the dielectric plate 12. Ions and radicals that are generated by the surface-wave plasma excite and decompose the process gas that is fed from the second gas supply pipe, thus generating radicals and ions. The ions and radicals of the excited process gas process the surface of the substrate 24. In this process, for example, an oxide film or a nitride film is formed on the surface of the substrate 24, or the surface of the substrate 24 is etched or ashed.

For example, ions and radicals of oxygen and argon (Ar) due to the plasma 22 reach the substrate 24 by diffusion, and react with the TEOS on the surface of the substrate 24. Thus, a silicon dioxide film is formed.

The introduction of the process gas by the gas introducing system and the evacuation by the evacuation pump are properly balanced, thereby maintaining a desired pressure in the chamber. The microwave oscillator 2, which is an instance of the electromagnetic wave source, is oscillated, and electromagnetic waves are radiated into the process chamber 7 via the electromagnetic wave introducing section 21. Thereby, the process gas is subjected to dissociation and ionization due to electromagnetic wave energy, and the plasma 22 is generated. If the electron density in the generated plasma 22 increases, a surface-wave plasma occurs. The surface-wave plasma occurs over the entire surface of the dielectric plate 12. The activated ions in the generated surface-wave plasma excites the second process gas. The substrate 24 is processed by the excited ions or active radicals. The process by the surface-wave plasma is characterized by a high film-formation rate and low damage.

First Embodiment

Figure 5:
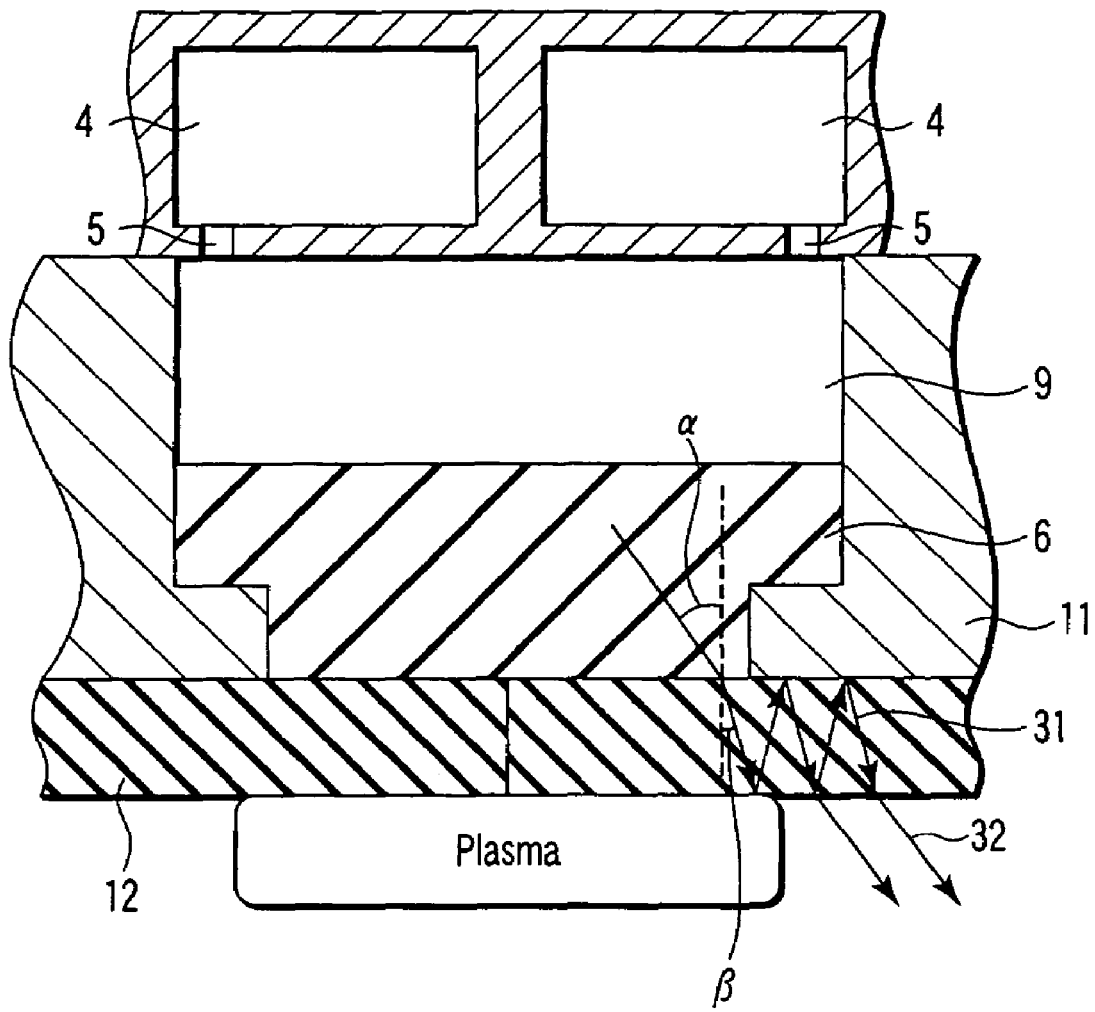
FIG. 5 schematically illustrates propagation of electromagnetic waves in the electromagnetic wave introducing section.

The state of the plasma 22 at the electromagnetic wave introducing section 21 was examined in detail, and the following result was found. FIG. 5 is a cross-sectional view that shows, in enlarged scale, the region of one dielectric window 6 of the electromagnetic wave introducing section 21 shown in FIG. 2A. Electromagnetic waves that come from the slots 5 enter the dielectric window 6, which is supported by the beams 11, through the cavity portion 9. The electromagnetic waves that have passed through the dielectric window 6 are radiated into the processing chamber 7. Although the electromagnetic waves are radiated to the region just below the dielectric window 6, the electromagnetic waves are not radiated to the region just below the metallic beam 11 since the conductor of the metallic beam 11 is exposed. Consequently, the electromagnetic waves are cut off at the region just below the beam 11. As a result, the uniformity in plasma deteriorates.

In order to improve the uniformity in plasma 22, the following attempt was made. That is, the dielectric plate 12 was disposed at the region of each beam 11, and surface waves were propagated at the boundary between the dielectric plate 12 and the plasma 22, thereby to spread the plasma.

In order to generate surface waves that propagate at the boundary between the dielectric plate 12 and plasma 22, it is necessary to generate a high-density plasma 22 that meets the following condition for surface-wave plasma, as described on pages 61 to 70 of "Technology of Microwave Plasma" (published by Ohmsha):

$$N_e = (\epsilon_d + 1)^{0.5} \cdot (m_e \cdot \epsilon_0 \cdot \omega^2/e^2)$$

where $\epsilon_d$: the specific inductive capacity of the dielectric plate, $m_e$: the mass of electron, $\epsilon_0$: the dielectric constant of vacuum, $\omega$: the angular frequency of plasma excitation electromagnetic waves, and $e$: the charge of electron.

This equation demonstrates that in order to generate a surface-wave plasma, it is necessary to maintain an electron density that is calculated by multiplying the cut-off electron density (the second term in the above equation) for localizing the plasma by $(\epsilon_d + 1)^{0.5}$.

However, the plasma, in which oxygen is mixed as in the plasma oxidation process, requires an electromagnetic wave input power that is 2 to 3 times higher than in the case of, e.g. argon plasma, in order to obtain a high electron density.

The reason for this has been studied. Assume now that the phenomenon, in which an electron is captured by an atom or a molecule and a negative ion is produced, is referred to as "attachment". The strength of bond in this case is evaluated by electron affinity. An atom or molecule, which has a greater electron affinity, tends to become a negative ion more easily. The electron affinity of an oxygen atom is estimated to be 1.465 eV, and a negative ion can easily be produced. On the other hand, the electron affinity of an inert gas molecule of, e.g. argon is a minus value, and a negative ion is not produced.

An $O^-$ ion is produced mainly by three-body collision attachment between an oxygen atom and an electron and by dissociation attachment between an oxygen molecule and an electron:

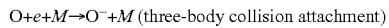

$O + e + M \rightarrow O^- + M$ (three-body collision attachment)

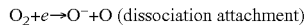

$O_2 + e \rightarrow O^- + O$ (dissociation attachment)

In the case of oxygen plasma, the electrons generated by dissociation are also consumed in the production of negative ions, and the diffusion distance of plasma decreases. It is thus considered that the plasma does not easily spread to the region under the beam, compared to the inert gas plasma of argon, etc., in which no negative ions are produced (see "Plasma Gas-Phase Reaction Engineering" (S. Teii, S. Ono) published by Uchida Rokakuho Pub.).

In order to improve the uniformity of the large-area plasma 22, an attempt has been made to spread the plasma 22 by disposing the dielectric plate 12 at the region of each beam 11 and causing electromagnetic waves to propagate as propagation waves inside dielectric 31 within the dielectric plate 12. If the propagation waves inside dielectric 31, which propagate within the dielectric plate 12, occur, the electromagnetic waves also propagate in the region just below the beam 11. As a result, it was found that with the electromagnetic wave propagation, electromagnetic waves 32 are radiated from the surface of the dielectric plate 12 into the processing chamber 7, and a plasma can be generated even immediately below the beam 11. FIG. 5 shows only the region of one dielectric window 6 of the electromagnetic wave introducing section 21 shown in FIG. 2A. Actually, the same structural parts are successively disposed, and the waves 31 propagate within the dielectric plates 12 from the neighboring electromagnetic wave introducing section 21. As a whole, a large-area, continuous, uniform plasma can be produced even immediately below the beams 11.

The thickness h of the dielectric plate 12, which meets this condition, is set at ½ or more of the intra-dielectric wavelength of electromagnetic waves. As a result, even in a propagation mode in which the E-plane is parallel to the thickness of the dielectric plate 12, no cutoff wavelength occurs and waves can propagate within the dielectric plate 12.

In addition, if the plasma frequency at the region of the beam 11 becomes equal to the frequency of electromagnetic waves, the plasma apparently becomes "conductor". As shown in FIG. 5, the electromagnetic waves are multiply reflected as intra-dielectric-plate propagation waves 31 between the part of the beam 11 and the plasma, and further spread. If the electromagnetic waves propagate within the dielectric plate 12, the electron density in the plasma is increased, the transition to a surface-wave plasma is facilitated, and a surface-wave plasma is generated. Thereby, even in the configuration including the beams 11, the uniform plasma can be formed.

The relationship between the thickness h of the dielectric plate 12, which is variously changed, and the generation of the uniform plasma, which is generated by the propagation of intra-dielectric-plate propagation waves 31 within the dielectric plate 12, was examined in detail. FIGS. 6A and 6B show the results of the examination. FIG. 6A shows a light-emission distribution of the plasma 22, which was measured with a configuration including dielectric plates 12 having different thicknesses h, which vary from 3 mm to 5 mm to 7.5 mm to 10 mm from the left.

FIG. 7 illustrates the method of the measurement. As is shown in FIG. 7, the work table 23 is removed from the plasma processing apparatus 1 shown in FIG. 3. The plasma processing apparatus 1 is equipped with a flange 33 having an opening, a quartz window 34 that is fixed on the opening via an O-ring, and a CCD camera 35 that observes the light-emission state of the plasma 22 from under the quartz window 34. The light-emission intensity distribution of the plasma 22 was measured by the CCD camera 35.

It was found, as shown in FIG. 6A, that the light-emission intensity of the plasma generated under the beams 11 was low and dark parts of the plasma 22 were formed under the beams 11, and that the light-emission intensity of the plasma generated under the dielectric windows 6 was high and light parts of the plasma 22 were formed under the dielectric windows 6. It is considered that the difference in light-emission intensity of the plasma 22 corresponds to the plasma density. With the same plasma processing apparatus 1, a silicon oxide film was formed using TEOS and oxygen as process gases, and a film thickness distribution of the formed film was measured.

As a result, a film thickness distribution, which substantially corresponds to the plasma light-emission intensity distribution shown in FIG. 6A, was obtained. Specifically, the film portion corresponding to the light part of the plasma had a large thickness while the film portion corresponding to the dark part of the plasma had a small thickness, and the uniformity in film thickness was very poor. FIG. 6B shows a measurement result of the plasma light-emission distribution in the case where the thickness of each of the dielectric plate 12 was increased to 30 mm. FIG. 6B, unlike FIG. 6A, shows the plasma that has a uniform light part as a whole.

Similarly, with the same plasma processing apparatus 1, a silicon dioxide film was formed using TEOS and oxygen as process gases, and a film thickness distribution of the formed film was measured. A film thickness distribution with good uniformity, which substantially corresponds to the plasma light-emission intensity distribution shown in FIG. 6B, was successfully obtained.

As shown in FIG. 6B, the thickness of the quartz plates that serve as dielectric plates 12 was set at 30 mm that corresponds to ½ of the wavelength of 2.45 GHz microwaves propagating within the quartz plates. Thereby, the spreading of the plasma was remarkably improved. To be more specific, the thickness h of the dielectric plate 12 was set ½ or more of the wavelength (in the case of quartz the specific dielectric constant is 3.8 to 4.0 and the intra-dielectric wavelength is about 60 mm) of microwaves propagating within the dielectric plate 12. Thereby, it is considered that no cutoff wavelength occurs even in the propagation mode in which the E-plane is parallel to the thickness of the dielectric plate 12 and the electromagnetic waves are made to propagate within the dielectric plate 12.

In a case where alumina ($Al_2O_3$) plates were used as dielectric plates 12, the uniformity was improved when the thickness of the alumina plate was set at 20 mm or more. A possible reason for this is that the specific dielectric constant of alumina is about 8.5 to 9.6, and the intra-dielectric-plate wavelength of 2.45 GHz microwaves is 40 mm. For example, a silicon film of the to-be-processed substrate was subjected to plasma oxidation. As a result, a film thickness distribution of a formed oxide film, which corresponds to a plasma light-emission distribution, occurred. It was thus found that there is a correlation between the plasma light-emission distribution and the electric field distribution of electromagnetic waves that are radiated from the dielectric plates 12.

Second Embodiment

Figure 8:
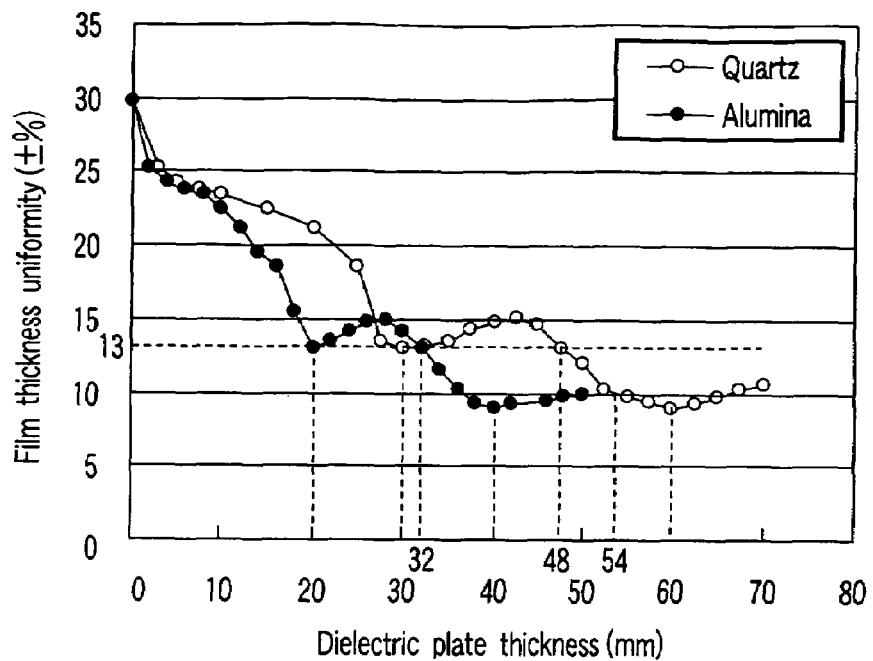
FIG. 8 is a graph that shows the film thickness uniformity of a silicon dioxide film in a case where the thickness of the dielectric plate is varied.

In a case where the thickness of the quartz plate that is the dielectric plate 12 in the first embodiment was gradually increased to 54 to 60 mm or more, it was observed that the uniformity in plasma light-emission intensity distribution was further improved. In addition, the uniformity in film thickness distribution of a silicon dioxide film, which was formed using the same plasma processing apparatus 1, was measured. FIG. 8 shows measurement results. In FIG. 8, the thicknesses of dielectric plates 12 of quartz and dielectric plates 12 of alumina were gradually increased, and silicon dioxide films were formed under the same conditions. The uniformity in film thickness distribution was plotted on the ordinate, and the thickness of the quartz or alumina plates was plotted on the abscissa.

To begin with, the result relating to the quartz dielectric plates 12 (indicated by circles in white) is described. When the thickness was set at 30 mm, as mentioned above, good uniformity (±13%) was obtained. When the thickness of the quartz dielectric plate was gradually increased, the uniformity once deteriorated but became better again. When the thickness was 48 mm (about ⅘ of the intra-quartz propagation wavelength), the uniformity of ±13%, which is the same as in the case of the quartz plate thickness of 30 mm, was obtained. When the quartz plate thickness was increased to 54 mm, very good film thickness uniformity of ±10% or less was successfully obtained. The value of uniformity continued to decrease in the range of 54 mm to 60 mm. The range of plate thickness of 54 mm to 60 mm substantially corresponds to the wavelength of electromagnetic waves within the quartz. This improvement surpassed that in light-emission intensity distribution and uniformity in the case where the thickness was set at ½ of the wavelength of electromagnetic waves in the first embodiment.

In the case where alumina ($Al_2O_3$) plates were used as dielectric plates 12 (indicated by circles in black), when the thickness of the alumina plate was gradually increased up to 20 mm, good uniformity of ±13% was obtained. When the thickness of the alumina plate was further increased, the uniformity once deteriorated but became better again, similarly with the case of the quartz plates. When the thickness was 32 mm (about ⅘ of the intra-alumina wavelength of electromagnetic waves), the uniformity of ±13%, which is the same as in the case of the alumina plate thickness of 20 mm, was obtained. When the alumina plate thickness was further increased to 40 mm, very good film thickness uniformity of ±10% or less was successfully obtained. The plate thickness of 40 mm substantially corresponds to the wavelength of electromagnetic waves within the alumina. Like the case of the quartz (circles in white), this improvement surpassed the improvement in film thickness uniformity in the case where the thickness was set at ½ of the wavelength of electromagnetic waves in the first embodiment. Additionally, the uniformity in plasma light-emission intensity distribution with the alumina plate thickness of 40 mm or more was measured, and an improved uniform light-emission intensity distribution, which is better than in the case of the plate thickness of 20 mm, was observed.

Figure 9A:
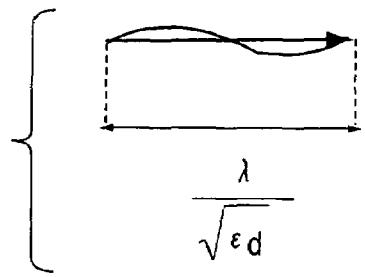
FIG. 9A is a view for explaining a wavelength and a direction of travel of the electromagnetic wave in a dielectric body.
Figure 9B:
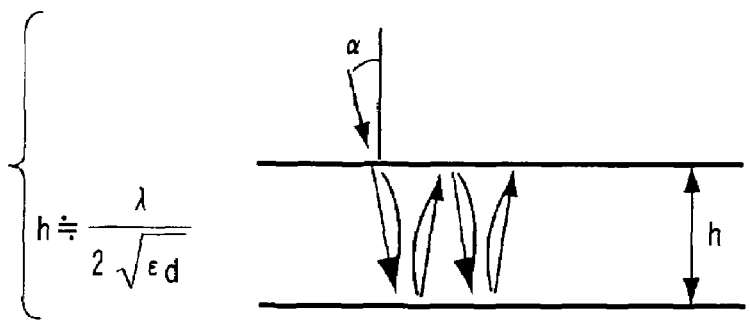
FIG. 9B is a view for explaining the state of multiple reflection of the electromagnetic wave that propagates within the dielectric plate.

The above-described phenomenon is explained with reference to FIGS. 9A and 9B. FIG. 9A is a diagram of an electromagnetic wave for the purpose of a simple explanation of the wavelength and the direction of travel of an electromagnetic wave within a dielectric body. For example, in FIG. 9A, the electromagnetic wave travels from the left to the right and has a length and a phase corresponding to 1 cycle of the intra-dielectric wavelength. In FIG. 9B, the thickness h of the dielectric plate 12 is set at ½ of the intra-dielectric wavelength $\lambda/2 \cdot (\in d)^{0.5}$. As shown in FIG. 9B, if the thickness of the dielectric plate 12 is set at ½ of the wavelength of the electromagnetic wave, the electromagnetic wave propagates within the dielectric plate 12. However, this plate thickness is a minimum thickness that meets the condition for propagation, that is, a thickness close to a cutoff wavelength. It is thus considered that the electromagnetic wave propagates while multiply reflecting within the dielectric plate 12, with the result that a propagation loss in electromagnetic wave increases and the electromagnetic wave attenuates before it sufficiently spreads.

On the other hand, consider a case where the thickness of the dielectric plate 12 is made greater than ½ of the wavelength of the electromagnetic wave within the dielectric body. If the thickness is increased to ⅘ or more of the intra-dielectric wavelength or to a value substantially equal to the intra-dielectric wavelength, the thickness becomes sufficiently greater than the cutoff wavelength. It thus appears that the propagation loss in multiple reflection decreases and the electromagnetic wave sufficiently propagates in the transverse direction, resulting in better plasma uniformity and accordingly in better film thickness uniformity.

From the above, it is understood that still better uniformity can be obtained under the condition that the thickness h of the dielectric plate 12 is ⅘ or more of the intra-dielectric wavelength (the plate thickness of 48 mm or more in the case of quartz and the plate thickness of 32 mm or more in the case of alumina) and the condition that the thickness h of the dielectric plate 12 is greater than the intra-dielectric wavelength (the plate thickness of 54 to 60 mm or more in the case of quartz and the plate thickness of 40 mm or more in the case of alumina).

In the above description, quartz and alumina have been used as materials of the dielectric plate 12. The material of the dielectric plate 12 is not limited to these, and other dielectric materials are usable. For instance, a Lowk material with a still lower dielectric constant is usable. Specifically, a porous material is usable. The dielectric plate 12 requires no airtightness since no vacuum-seal is effected in the region of the dielectric plate 12. The porous Lowk material is light in weight and is advantageous for supporting by the beams 11 or for reduction in weight of the entire apparatus.

Third Embodiment

Figure 10:
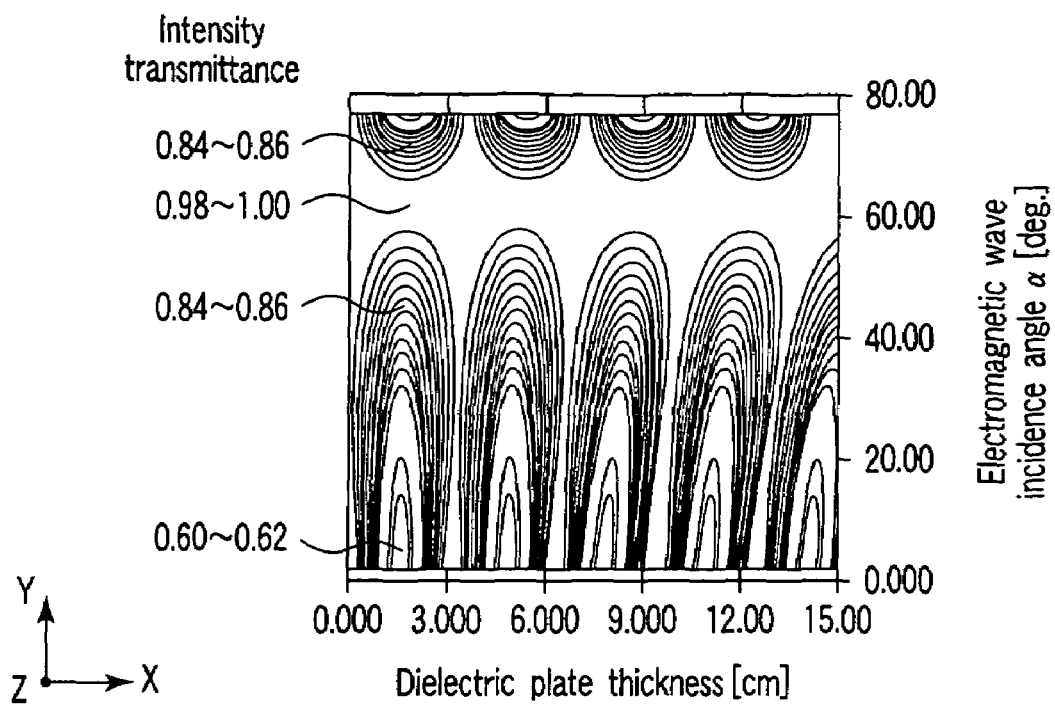
FIG. 10 is a graph that shows the intensity transmittance of electromagnetic waves in a case where an electromagnetic wave incidence angle α and a dielectric plate thickness h are varied.

In a third embodiment of the invention, with the attachment of the dielectric plate 12 having a thickness of ½ or more of the wavelength of the electromagnetic wave propagating within the dielectric plate 12, the condition for plasma generation with good uniformity was examined. In FIG. 10, the abscissa indicates the thickness of the dielectric plate 12 and the ordinate indicates an incidence angle α of the electromagnetic wave (see FIG. 5). FIG. 10 shows, by contour lines, the transmittance of electromagnetic waves that are made incident from the dielectric window 6 (quartz dielectric window 6 in this case) on the dielectric plate 12 (quartz dielectric plate 12 in this case).

That the electromagnetic wave transmittance is close to 1 means that reflection hardly occurs at the interface between the dielectric window 6 and dielectric plate 12 and good propagation of electromagnetic waves occurs in the dielectric plate 12. In the case of the dielectric plate 12 having a thickness corresponding to an m-number (m=an integer of 1 or more) of times of ½ of the wavelength of electromagnetic waves that propagate within the dielectric plate 12, a good intensity transmittance (close to 1) is exhibited at the incidence angle α of all electromagnetic waves.

Assuming that the refraction angle of the electromagnetic wave that is incident on the dielectric plate 12 is β, good plasma uniformity is obtained when the thickness h of the dielectric plate shown in FIG. 1 meets the following equation:

$$h = (m \cdot \pi \cdot \lambda)/(2\pi \cdot (\in_d)^{0.5} \cdot \cos \beta)$$

where h: the thickness of the dielectric plate, m: an integer of 1 or more, $\in_d$: the dielectric constant of the dielectric plate, and β: the refraction angle of the incident electromagnetic wave.

Thus, the thickness of the dielectric plate 12 can meet the condition (FIG. 6B) in which the intensity transmittance of the multiply reflected electromagnetic wave becomes 1, with the radiation characteristics (the radiation angle of electromagnetic waves) of the antenna used. The effect of multiply reflected waves can be minimized, and the electromagnetic wave can efficiently be radiated into the processing chamber 7.

Fourth Embodiment

Figures 11A, 11B:
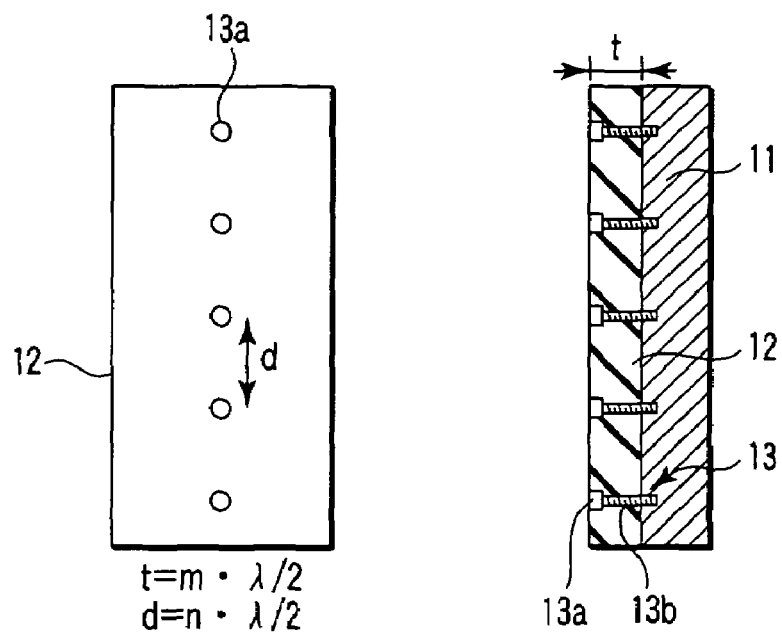
FIG. 11A is a view for describing the arrangement of dielectric plate fixing screws.
FIG. 11B is a view for describing the disposition of the dielectric plate fixing screws, dielectric plate, and beam.

A fourth embodiment of the invention aims at improving the uniformity in the Y-axis direction. As shown in FIG. 2B, the pitch p of the dielectric plate fixing screws 13 formed of conductive material, which fix the dielectric plates 12, is set at an n-number (n=an integer of 1 or more) of times of ½ of the wavelength of the electromagnetic waves that propagate within the dielectric plates 12. Thereby, the fixing screws 13 function as antennas for radiating the electromagnetic waves that have propagated within the dielectric plates 12. Hence, the uniformity of the plasma 22 can further be improved. FIG. 11A is a plan view that shows the state in which the dielectric plate 12 is attached to the beam 11 by the dielectric plate fixing screws 13 shown in FIGS. 2A and 2B, and FIG. 11B is a cross-sectional view showing this state.

Since the dielectric plate fixing screw 13 is used to mechanically fix the dielectric plate 12 to the beam 11, a screw shank 13b of the screw 13 is formed of a conductor such as a metal and a screw head 13a of the screw 13a is coated with a ceramic material such as alumina in order to ensure the resistance to corrosion and oxidation due to direct exposure to plasma. The dielectric plate 12 is fixed such that the screw 13 penetrates the dielectric plate 12 and the dielectric plate 12 is clamped between the screw head 13a and the beam 11. Thus, the electromagnetic wave that has propagated within the dielectric plate 12 is radiated from the conductive screw shank 13b, which functions as the antenna, into the processing chamber 7. In addition, by setting the pitch p at ½ or more of the wavelength of the electromagnetic wave that propagates within the dielectric plates 12, it becomes possible to prevent occurrence of side lobes due to interference between the fixing screws 13.

The configuration, in which the pitch p is set at ½ or more, or an n-number of times of ½, of the wavelength of the electromagnetic wave that propagates within the dielectric plates 12, is effective in improving the uniformity of plasma 22 in the Y-axis direction. Moreover, if the pitch p of the screws 13 in the fourth embodiment is applied to the pitch of the screws 13 in the first, second and third embodiments, the uniformity in plasma can be improved not only in the X-direction, but in both the X-axis direction and Y-axis direction.

Using the plasma processing apparatus 1 including the electromagnetic wave introducing section 21 with the above-described structure, a uniform plasma light-emission distribution was successfully obtained, for example, in the following embodiment. That is, a uniform plasma distribution, as shown in FIG. 6B, was obtained under the conditions that a mixture gas ($O_2/(Ar+O_2)=1\%$) of argon (Ar) and oxygen ($O_2$) was used as the first process gas, the gas pressure within the processing chamber 7 was set at 7.7 Pa and the microwave output power of the electromagnetic wave source 2 was set at 12 kW.

If the electron density in the plasma increases, a surface-wave plasma is generated. Excited ions in the surface-wave plasma excite the process gas. By the excited ions or active radicals, an oxide film is formed on the surface of the silicon film of the substrate 24. In other words, plasma oxidation is carried out by a plasma of a mixture gas of argon (Ar) and oxygen ($O_2$), and a plasma oxide film is formed on the surface of the silicon film. As a result, a low electron temperature of 1 eV or less and an interface state density of $4 \times 10^{10}$ cm$^{-2} \cdot$eV$^{-1}$ can be obtained. This low-temperature oxide film formation method enables formation of a TFT that includes a gate oxide film with a low threshold voltage.

Fifth Embodiment

In a fifth embodiment of the invention, a plasma process result and a simulation result were compared. The simulation was performed using a finite-integration electromagnetic wave field analysis software "MW-Studio (AET-Japan)", which is able to perform an electromagnetic field analysis in consideration of plasma. A condition of propagation of microwaves from the slot via the dielectric window to the region below the beam was simulated.

Figure 12:
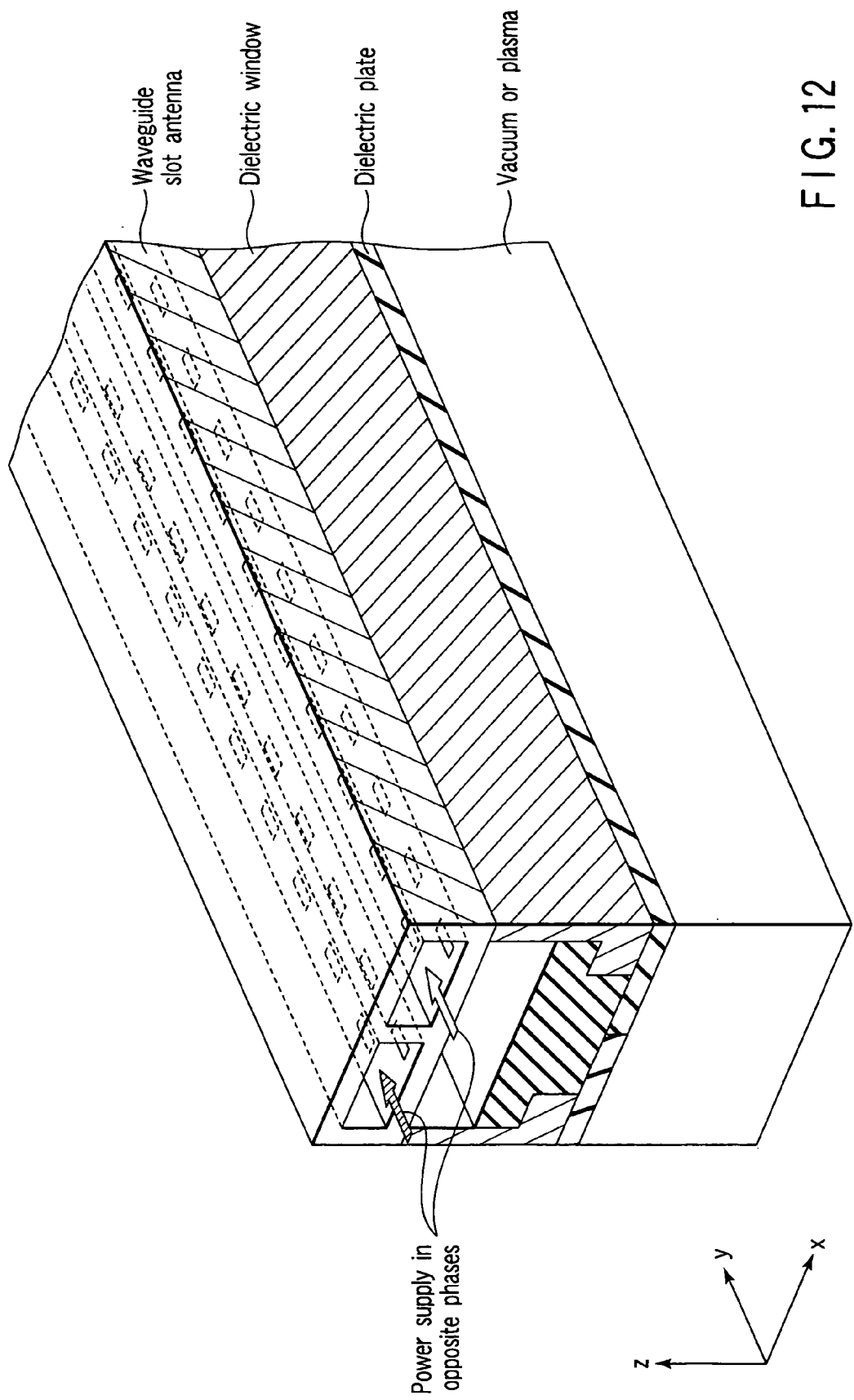
FIG. 12 shows an analysis model of simulation.

FIG. 12 shows an analysis model. In an assumed model, a cyclic boundary condition is set in the X-direction and paired waveguide slot antennas, which are supplied with power in opposite phases, are arranged infinitely.

Calculations were made in a case where a vacuum was created under the dielectric plate that is attached to the beam, and in a case where a plasma was generated under the dielectric plate. The plasma was approximated as a dispersive-medium bulk, and a first-order Drude dispersion model was used as the model of plasma. The first-order Drude dispersion model is defined by the following equation, and the dispersion equation is found from the plasma frequency and collision frequency (see "Electromagnetic Field and Antenna Analysis by FDTD" (T. Uno), Corona Publishing Co., Ltd.):

$$\in_r(\omega)=1+\omega_p^2/\omega(j\cdot v_c-\omega)$$

where $\in_r(\omega)$: the specific dielectric constant of first-order Drude dispersion, $\omega_p$: plasma angular frequency, and $v_c$: collision frequency.

Calculations were made by setting the plasma angular frequency at $1.77\times10^{10}$ rad/s, and the collision frequency at $2.45\times10^9$ Hz.

Figure 13:
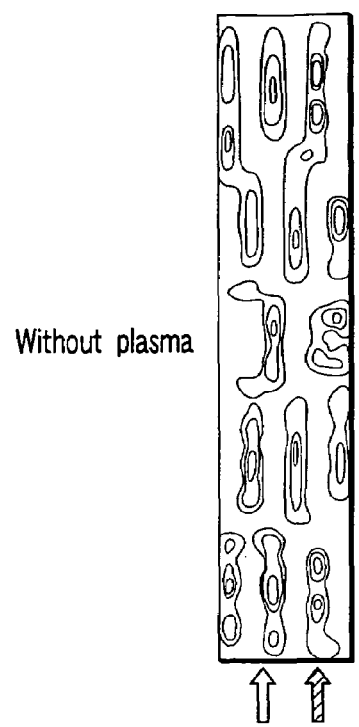
FIG. 13 shows a simulation result of an electric field intensity distribution in a Z-direction in the dielectric plate in the absence of plasma.
Figure 14:
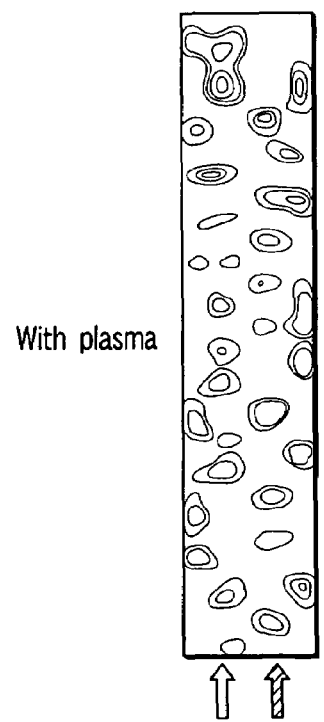
FIG. 14 shows a simulation result of an electric field intensity distribution in the Z-direction in the dielectric plate in the presence of plasma.

FIG. 13 and FIG. 14 show electric field intensity distributions in the Z-direction within the dielectric plate. It was understood that by the presence of plasma, electromagnetic waves were made to easily propagate within the dielectric plate including the part under the beam, and the uniformity in electric field intensity distribution was improved. With use of TEOS and oxygen as process gases, a silicon dioxide film was formed by a plasma processing apparatus that was manufactured on the basis of the simulation result and the setting values that were actually used in the simulation for plasma processing. A film thickness distribution of the formed silicon dioxide film was measured. The measured distribution substantially corresponds to the electric field intensity distribution as shown in FIG. 14, and a film thickness distribution with very high uniformity was successfully obtained.

As has been described above in detail, the present invention provides a plasma processing apparatus that can overcome the prior-art problems and can uniformly process a large-area substrate. In the above-described embodiments, a transition to surface-wave plasma was facilitated by causing electromagnetic waves to propagate within the dielectric plate 12. However, this invention is not limited to the surface-wave plasma. Even with respect to a plasma having a relatively low electron density, a wide-range plasma can be generated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
a processing chamber configured to enclose and process a substrate;
an electromagnetic source configured to output electromagnetic waves;
a plurality of waveguides configured to propagate the electromagnetic waves;
a waveguide antenna including a plurality of slots formed in each of the plurality of waveguides and configured to radiate the electromagnetic waves;
a plurality of dielectric windows formed of a dielectric material to transmit the electromagnetic waves, associated with the plurality of slots, and form a surface that is oriented towards an inner space of the processing chamber and are supported air tightly by metallic beams; and
a plurality of dielectric plates arranged between the plurality of dielectric windows and the processing chamber, sidewalls of adjacent dielectric plates of the plurality of dielectric plates being in direct contact with each other, the plurality of dielectric plates provided on inner surfaces of the plurality of dielectric windows and metallic beams, which support the plurality of dielectric windows in the processing chamber, such that plasma is continuously and uniformly produced in the processing chamber, and a thickness of each of the dielectric plates in direction of propagation of the electromagnetic waves is set substantially at a half a wavelength or more of the electromagnetic waves inside the dielectric plates,
wherein the plasma processing apparatus is configured to generate plasma by the electromagnetic waves that are radiated from the slots into the processing chamber via the plurality of dielectric windows, and the generated plasma is configured to process the substrate inside the processing chamber, and
wherein the plurality of dielectric plates are arranged such that a location where the plates are laterally in contact with each other is located under the plurality of dielectric windows, and is centered between the side edges of the plurality of dielectric windows so as not to be under a seam of adjacent dielectric windows, and the plurality of dielectric plates are attached to a lower surface of the metallic beams by fixing members.

2. The plasma processing apparatus according to claim 1, wherein the thickness of the dielectric plates in the direction in which the electromagnetic waves propagate is set at a value that satisfies a following equation:

$$h=(m\cdot\pi\cdot\lambda)/(2\pi\cdot(\in_d)^{0.5}\cdot\cos\beta)$$

where h: the thickness of the dielectric plate, m: an integer of 1 or more, $\lambda$: a wavelength of the electromagnetic waves in a vacuum, $\in_d$: a specific dielectric constant of the dielectric plate, and $\beta$: a refraction angle at which the electromagnetic waves are incident on the dielectric plate.

3. The plasma processing apparatus according to claim 1, wherein the fixing members are spaced apart with a pitch of a half a wave length or more of the electromagnetic waves inside the dielectric plates, and are at least partly formed of a conductive material.

4. The plasma processing apparatus according to claim 3, wherein the fixing members are arranged such that the fixing members are spaced apart with a pitch of an n-number (n=an integer of 1 or more) of times of a half a wave length or more of the electromagnetic waves inside the dielectric plates.

5. The plasma processing apparatus according to claim 1, wherein the fixing members are arranged to penetrate the dielectric plates so as not to obstruct a surface of the plurality of dielectric plates that faces the processing chamber.

6. The plasma processing apparatus according to claim 1, wherein a center portion of an upper surface of the plurality of dielectric plates is in contact with the lower surface of the metallic beams, and the fixing members are arranged at a center of the plurality of dielectric plates and the metallic beams.

7. A plasma processing apparatus including a plurality of waveguides that are configured to distribute electromagnetic waves from an electromagnetic wave source, the apparatus comprising:
a plurality of dielectric windows formed of a dielectric material, to transmit the electromagnetic waves, associated with a plurality of slot antennas, and forming a surface that is oriented towards an inner space of the processing chamber and are supported air tightly by metallic beams to form a sealed surface of the processing chamber; and
a plurality of dielectric plates arranged between the plurality of dielectric windows and the processing chamber, sidewalls of adjacent dielectric plates of the plurality of dielectric plates being in direct contact with each other, the plurality of dielectric plates provided on inner surfaces of the plurality of dielectric windows and metallic beams, which support the plurality of dielectric windows in the processing chamber, such that plasma is continuously and uniformly produced in the processing chamber, and a thickness of each of the dielectric plates in a direction of propagation of the electromagnetic waves is set substantially at a half wavelength or more of the electromagnetic waves inside the dielectric plate, wherein the plasma processing apparatus is configured to generate a surface-wave plasma on inner wall surfaces of the dielectric plates by the electromagnetic waves that are radiated from the slots into the processing chamber via the plurality of dielectric windows, and the generated plasma is configured to process the substrate inside the processing chamber, and wherein the plurality of dielectric plates are arranged such that a location where the plates are laterally in contact with each other is located and under the plurality of dielectric windows, and is centered between side edges of the plurality of dielectric windows so as not to be under a seam of adjacent dielectric windows, and the plurality of dielectric plates are attached to a lower surface of the metallic beams by fixing members.

8. The plasma processing apparatus according to claim 7, wherein the
fixing members are arranged to penetrate the dielectric plates so as not to obstruct a surface of the plurality of dielectric plates that faces the processing chamber.

9. The plasma processing apparatus according to claim 7, wherein a center portion of an upper surface of the plurality of dielectric plates is in contact with the lower surface of the metallic beams, and the fixing members are arranged at a center of the plurality of dielectric plates and the metallic beams.

* * * * *